(12) United States Patent
Choi et al.

(10) Patent No.: US 10,658,623 B2
(45) Date of Patent: May 19, 2020

(54) ELECTROLUMINESCENT DISPLAY DEVICE HAVING A PLURALITY OF LOW-REFRACTIVE MEMBERS

(71) Applicant: LG Display Co., Ltd., Seoul (KR)

(72) Inventors: Yong-Hoon Choi, Paju-si (KR); Won-Hoe Koo, Paju-si (KR)

(73) Assignee: LG DISPLAY CO., LTD., Seoul (KR)

(*) Notice: Subject to any disclaimer, the term of this patent is extended or adjusted under 35 U.S.C. 154(b) by 32 days.

(21) Appl. No.: 16/171,086

(22) Filed: Oct. 25, 2018

(65) Prior Publication Data
US 2019/0131581 A1 May 2, 2019

(30) Foreign Application Priority Data
Oct. 31, 2017 (KR) .................. 10-2017-0144070

(51) Int. Cl.
*H01L 51/52* (2006.01)
*H01L 51/56* (2006.01)
*H01L 27/32* (2006.01)

(52) U.S. Cl.
CPC ...... *H01L 51/5275* (2013.01); *H01L 27/3246* (2013.01); *H01L 27/3258* (2013.01); *H01L 51/5206* (2013.01); *H01L 51/5221* (2013.01); *H01L 51/5253* (2013.01); *H01L 51/5271* (2013.01); *H01L 51/56* (2013.01); *H01L 27/322* (2013.01); *H01L 27/326* (2013.01); *H01L 51/5209* (2013.01); *H01L 51/5225* (2013.01); *H01L 2251/5315* (2013.01); *H01L 2251/558* (2013.01)

(58) Field of Classification Search
CPC ............. H01L 51/5275; H01L 51/5206; H01L 51/5221; H01L 51/5253; H01L 51/56; H01L 27/322; H01L 27/3246
See application file for complete search history.

(56) References Cited

U.S. PATENT DOCUMENTS

| 8,624,259 B2* | 1/2014 | Lee | H01L 27/3246 |
| | | | 257/72 |
| 9,978,814 B2* | 5/2018 | Jang | H01L 51/5275 |

(Continued)

FOREIGN PATENT DOCUMENTS

CN        101834279 A     9/2010

*Primary Examiner* — Ida M Soward
(74) *Attorney, Agent, or Firm* — Seed IP Law Group LLP

(57) ABSTRACT

An electroluminescent display device includes an overcoat layer on a substrate; a plurality of low-refractive members formed of an inorganic matter and disposed on the overcoat layer; a first electrode on the overcoat layer and the plurality of low-refractive members; a bank layer disposed on the overcoat layer and the first electrode and including an opening configured to expose the first electrode; an emitting layer disposed on the first electrode; and a second electrode disposed on the emitting layer, wherein each of the plurality of low-refractive members includes a first flat surface contacting the first electrode, a second flat surface having an area greater than that of the first flat surface and contacting the overcoat layer and first and second inclined surfaces connecting the first flat surface and the second flat surface, and, wherein a refractive index of each of the plurality of low-refractive members is lower than those of the overcoat layer and the first electrode.

15 Claims, 10 Drawing Sheets

(56) References Cited

U.S. PATENT DOCUMENTS

| | | | |
|---|---|---|---|
| 9,978,819 B2* | 5/2018 | Jang | H01L 51/5209 |
| 10,008,555 B2* | 6/2018 | Yoo | H01L 51/56 |
| 10,020,351 B2* | 7/2018 | Yang | H01L 27/3246 |
| 10,177,212 B2* | 1/2019 | Choi | H01L 27/3258 |
| 2010/0176717 A1* | 7/2010 | Lee | H01L 51/5271 |
| | | | 313/504 |
| 2011/0073885 A1* | 3/2011 | Kim | H01L 27/3211 |
| | | | 257/89 |
| 2012/0061653 A1* | 3/2012 | Yamazaki | H01L 27/3209 |
| | | | 257/40 |
| 2016/0307976 A1* | 10/2016 | You | H01L 27/3246 |
| 2018/0122875 A1* | 5/2018 | Bang | H01L 51/5212 |
| 2018/0153049 A1* | 5/2018 | Song | B32B 3/16 |
| 2018/0267358 A1* | 9/2018 | Choi | G02F 1/133528 |
| 2019/0067383 A1* | 2/2019 | Jo | H01L 27/3213 |
| 2019/0067642 A1* | 2/2019 | Kim | H01L 27/3246 |
| 2019/0131580 A1* | 5/2019 | Youn | H01L 51/5275 |
| 2019/0189715 A1* | 6/2019 | Nendai | H01L 51/5275 |

* cited by examiner

US 10,658,623 B2

ELECTROLUMINESCENT DISPLAY DEVICE HAVING A PLURALITY OF LOW-REFRACTIVE MEMBERS

CROSS-REFERENCE TO RELATED APPLICATIONS

This application claims priority to and the benefit of Korean Patent Application No. 2017-0144070, filed on Oct. 31, 2017, in the Korean Intellectual Property Office, which is incorporated herein by reference in its entirety.

BACKGROUND

Technical Field

The present disclosure relates to an electroluminescent display device, and more particularly, to an electroluminescent display device capable of improving light extraction efficiency.

Description of the Related Art

Recently, flat panel displays having excellent characteristics such as being thin, lightweight, and having low power consumption have been widely developed and applied to various fields.

Among the flat panel displays, an electroluminescent display device is a device in which a charge is injected into an emitting layer formed between a cathode, which is an electron-injecting electrode, and an anode, which is a hole-injecting electrode, such that excitons are formed by electrons and holes, and then radiative recombination of the excitons occurs such that light is emitted.

Such an electroluminescent display device has advantages in that not only is it able to be formed even on a flexible substrate such as plastic, but also has a large contrast ratio due to being a self-emitting type, is able to easily realize a dynamic image due to having a response time of about several microseconds (μs), has no limit in terms of viewing angle, is stable even at a low temperature, and is able to be driven at a relatively low voltage of DC 5 V to 15 V such that it is easy to manufacture and design a drive circuit.

FIG. 1 is a schematic cross-sectional view of a conventional electroluminescent display device.

As illustrated in FIG. 1, an electroluminescent display device 1 includes a substrate 10, a thin film transistor Tr disposed on the substrate 10, a color filter 50 over the substrate 10, and a light-emitting diode D disposed above the substrate 10 and connected to the thin film transistor Tr, wherein an encapsulation layer (not shown) may be disposed above the light-emitting diode D.

The light-emitting diode D includes a first electrode 41, an emitting layer 42, and a second electrode 43, wherein light from the emitting layer 42 is output to the outside through the first electrode 41.

The light emitted from the emitting layer 42 passes through various configurations of the electroluminescent display device 1 and exits the electroluminescent display device 1.

However, an optical waveguide mode which is configured by a surface plasmon component generated at a boundary between a metal and the emitting layer 42 and the emitting layer 42 inserted into reflective layers at both sides accounts for about 60 to 70% of emitted light.

Accordingly, among light emitted from the emitting layer 42, rays of light that are trapped in the electroluminescent display device 1 instead of exiting the electroluminescent display device 1 are present. Thus, there is a problem in that light extraction efficiency of the electroluminescent display device 1 is degraded.

BRIEF SUMMARY

It is an object of the present disclosure to provide an electroluminescent display device in which a low-refractive member is disposed below a first electrode and a light extraction member is formed on an inclined surface of the first electrode so that light extraction efficiency is improved.

To achieve the above-described object, the present disclosure provides an electroluminescent display device including an overcoat layer on a substrate; a plurality of low-refractive members formed of an inorganic matter and disposed on the overcoat layer; a first electrode on the overcoat layer and the plurality of low-refractive members; a bank layer disposed on the overcoat layer and the first electrode and including an opening configured to expose the first electrode; an emitting layer disposed on the first electrode; and a second electrode disposed on the emitting layer, wherein each of the plurality of low-refractive members includes a first flat surface contacting the first electrode, a second flat surface having an area greater than that of the first flat surface and contacting the overcoat layer and first and second inclined surfaces connecting the first flat surface and the second flat surface, and, wherein a refractive index of each of the plurality of low-refractive members is lower than those of the overcoat layer and the first electrode.

It is to be understood that both the foregoing general description and the following detailed description are examples and are explanatory and are intended to provide further explanation of the invention as claimed.

BRIEF DESCRIPTION OF THE SEVERAL VIEWS OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION

Hereinafter, exemplary embodiments of the present disclosure will be described with reference to the accompanying drawings.

Figure 1:
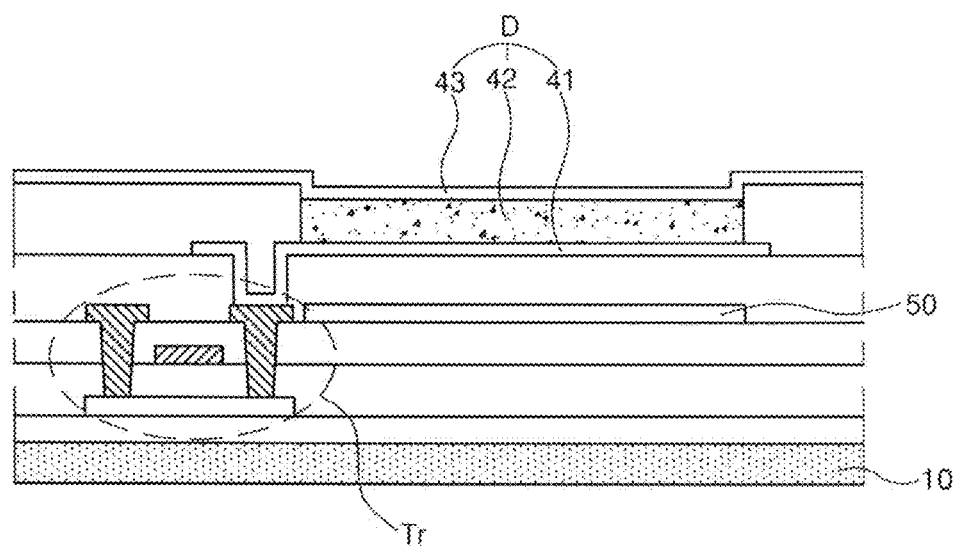
FIG. 1 is a cross-sectional view schematically illustrating a conventional electroluminescent display device.
Figure 2:
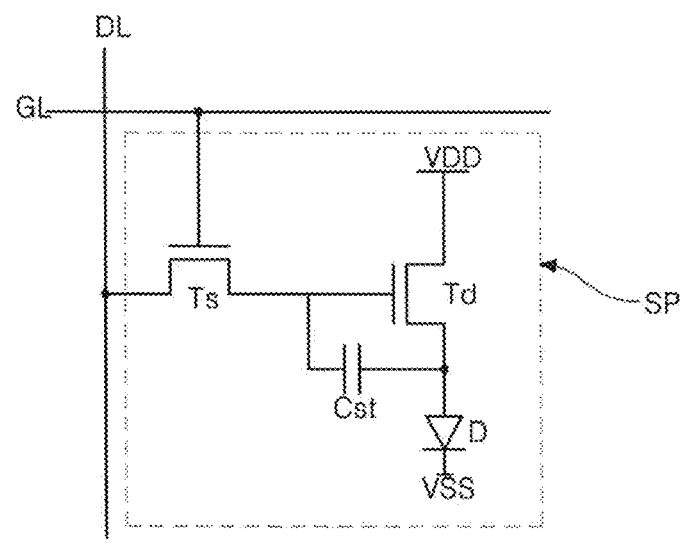
FIG. 2 is a circuit diagram illustrating a single subpixel area of an electroluminescent display device according to an embodiment of the present disclosure.

FIG. 2 is a circuit diagram illustrating a single subpixel area of an electroluminescent display device according to an embodiment of the present disclosure.

As illustrated in FIG. 2, the electroluminescent display device according to an embodiment of the present disclosure includes a gate line GL and a data line DL which intersect with each other and define a subpixel area SP, wherein a switching thin film transistor Ts, a driving thin film transistor Td, a storage capacitor Cst, and a light-emitting diode D are formed in each pixel area P.

More specifically, a gate electrode of the switching thin film transistor Ts is connected to the gate line GL, and a source electrode is connected to the data line DL. A gate electrode of the driving thin film transistor Td is connected to a drain electrode of the switching thin film transistor Ts, and a source electrode is connected to a high-potential voltage VDD. An anode of the light-emitting diode D is connected to the source electrode of the driving thin film transistor Td, and a cathode is connected to a low-potential voltage VSS. The storage capacitor Cst is connected to the gate electrode and the source electrode of the driving thin film transistor Td.

In an image display operation of such an electroluminescent display device, the switching thin film transistor Ts is turned on in accordance with a gate signal applied through the gate line GL, and in this case, a data signal applied to the data line DL is applied to the gate electrode of the driving thin film transistor Td and one electrode of the storage capacitor Cst through the switching thin film transistor Ts.

The driving thin film transistor Td is turned on in accordance with the data signal and controls a current which flows in the light-emitting diode D so as to display an image. The light-emitting diode D emits light due to a current of the high-potential voltage VDD transmitted through the driving thin film transistor Td.

That is, since an amount of current which flows in the light-emitting diode D is proportional to an amplitude of the data signal, and an intensity of light emitted by the light-emitting diode D is proportional to the amount of current flowing in the light-emitting diode D, the pixel area P displays a grayscale, which differs in accordance with the amplitude of the data signal, and as a result, the electroluminescent display device displays an image.

The storage capacitor Cst serves to maintain a charge which corresponds to the data signal during one frame in order to make an amount of current flowing in the light-emitting diode D constant and maintain a grayscale, which the light-emitting diode D displays, to be constant.

A transistor and/or a capacitor other than the switching and driving thin film transistors Ts and Td and the storage capacitor Cst may be further added in the subpixel area SP.

Figure 3:
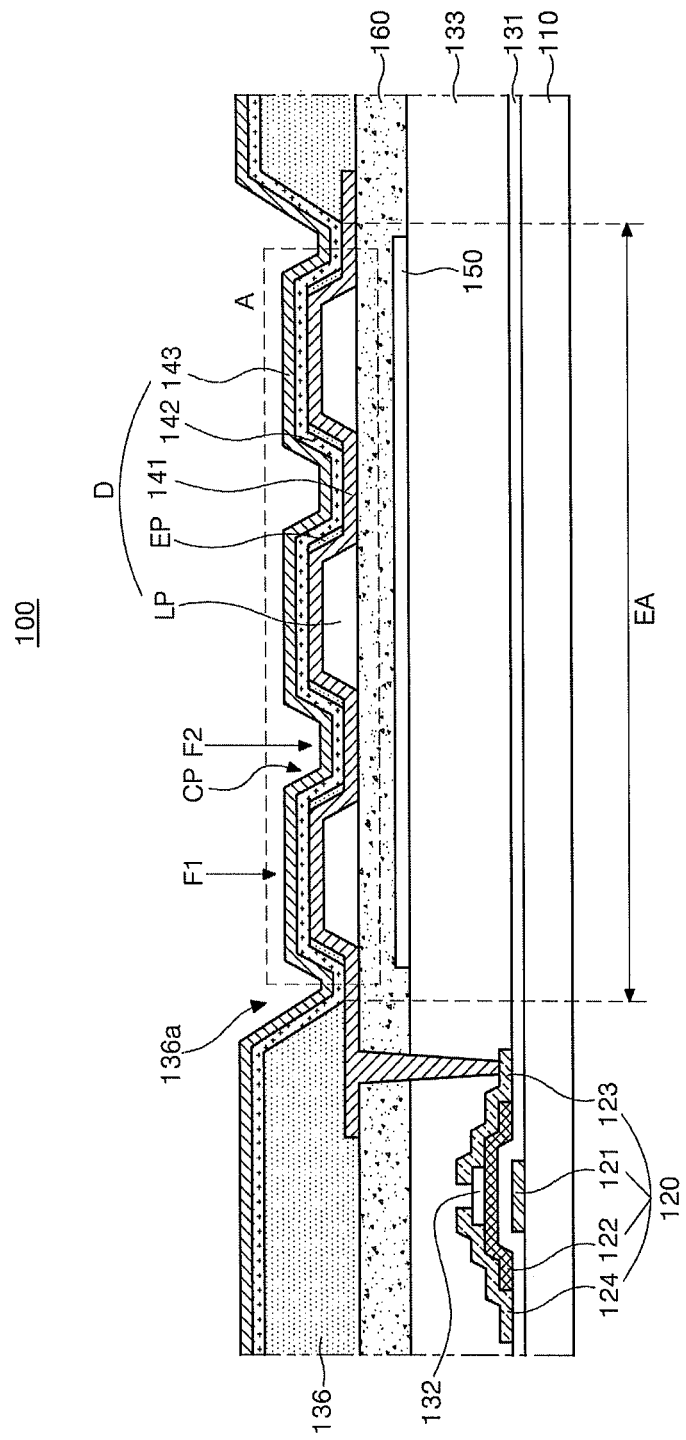
FIG. 3 is a cross-sectional view schematically illustrating an electroluminescent display device according to an embodiment of the present disclosure.

FIG. 3 is a cross-sectional view schematically illustrating an electroluminescent display device according to an embodiment of the present disclosure.

As illustrated in FIG. 3, an electroluminescent display device 100 according to an embodiment of the present disclosure includes a substrate 110, a thin film transistor 120, a color filter member 150, an overcoat layer 160, and a light-emitting diode D electrically connected to the thin film transistor 120.

The electroluminescent display device 100 according to the embodiment of the present disclosure is illustrated as being a bottom emission type in which light from an emitting layer 142 is output to the outside through a first electrode 141, but embodiments are not limited thereto.

That is, the electroluminescent display device 100 according to the embodiment of the present disclosure may also be a top emission type in which the color filter member 150 is disposed opposite the substrate 110, and light from the emitting layer 142 is output to the outside through a second electrode 143.

When the electroluminescent display device 100 is the top emission type, a reflective electrode or a reflective layer may be further formed below the first electrode 141. For example, the reflective electrode or the reflective layer may be formed of an aluminum-palladium-copper (APC) alloy. In this case, the second electrode 143 may have a relatively small thickness for light to transmit therethrough.

The electroluminescent display device 100 according to the embodiment of the present disclosure may include, on the substrate 110, a thin film transistor 120 which includes a gate electrode 121, an active layer 122, a source electrode 123, and a drain electrode 124.

Specifically, the gate electrode 121 of the thin film transistor 120 and a gate insulating film 131 may be disposed on the substrate 110.

The active layer 122 which overlaps the gate electrode 121 may be disposed on the gate insulating film 131.

An etch stopper 132 for protecting a channel area of the active layer 122 may be disposed on the active layer 122.

The source electrode 123 and the drain electrode 124, which come into contact with the active layer 122, may be disposed on the active layer 122.

The electroluminescent display device 100 to which embodiment of the present disclosure is applicable is not limited to that illustrated in FIG. 3. The electroluminescent display device 100 may further include a buffer layer disposed between the substrate 110 and the active layer 122, and the etch stopper 132 may not be disposed thereon.

For convenience of description, only the driving thin film transistor has been illustrated from among various thin film transistors that may be included in the electroluminescent display device 100. Although the thin film transistors 120 will be described as having an inverted staggered structure or bottom gate structure in which, with respect to the active layer 122, the gate electrode 121 is disposed opposite the source electrode 123 and the drain electrode 124, this is merely an example, and a thin film transistor, which has a coplanar structure or top gate structure in which, with respect to the active layer 122, the gate electrode 121 is disposed to be collinear with the source electrode 123 and the drain electrode 124, may also be used.

A protective layer 133 may be disposed on the drain electrode 124 and the source electrode 123, and the color filter member 150 may be disposed on the protective layer 133.

In this case, although the protective layer 133 is illustrated as smoothing an upper portion of the thin film transistor 120, the protective layer 133 may also be disposed along the shapes of surfaces of configurations located below the protective layer 133 instead of smoothing the upper portion of the thin film transistor 120.

The color filter member 150 is configured to selectively transmit light, which is emitted from the emitting layer 142, in accordance with a wavelength, and may be one of a red color filter member, a green color filter member, and a blue color filter member.

The color filter member 150 may be disposed at positions which correspond to an emissive area EA on the protective layer 133 and may only be disposed in portions of the emissive area EA.

Emissive area EA refers to an area in which the emitting layer 142 emits light due to the first electrode 141 and the second electrode 143, and the color filter member 150 being disposed at a position corresponding to the emissive area EA means that the color filter member 150 is disposed to prevent a blurring phenomenon and a ghost phenomenon which occur due to mixing of light emitted from adjacent emissive areas EA.

For example, the color filter member 150 may be disposed to overlap the emissive area EA and have a size smaller than or equal to that of the emissive area EA.

However, the arrangement position and size of the color filter member 150 may be determined by various factors such as a distance between the color filter member 150 and the first electrode 141, a distance between the color filter member 150 and the overcoat layer 160, and a distance between an emissive area EA and a non-emissive area, as well as the size and position of the emissive area.

A pixel of the present disclosure may include one or more subpixels. For example, a single pixel may include two to four subpixels.

Subpixel refers to a unit in which a specific type of color filter member 150 is formed or in which the light-emitting diode D is capable of emitting a particular color without the color filter member 150 being formed.

Colors defined in a subpixel may include red, green, blue, and optionally white, but embodiments are not limited thereto.

The overcoat layer 160 may be disposed on the color filter member 150 and the protective layer 133.

The protective layer 133 may be omitted. That is, the overcoat layer 160 may be disposed on the thin film transistor 120.

The color filter member 150 is illustrated as being disposed on the protective layer 133, but embodiments are not limited thereto. The color filter member 150 may be disposed at any position between the overcoat layer 160 and the substrate 110.

The overcoat layer 160 may be formed of an organic material having a refractive index in a range of about 1.5 to 1.55, but embodiments are not limited thereto.

A light-emitting diode D which includes a plurality of low-refractive members (low-refractive pattern) LP, the first electrode 141, a light extraction member (light extraction pattern) EP, the emitting layer 142, and the second electrode 143 may be disposed on the overcoat layer 160.

The light-emitting diode D of the electroluminescent display device 100 according to an embodiment of the present disclosure may include a first flat portion F1 and a second flat portion F2, whose heights differ, and a connecting portion CP configured to connect the first flat portion F1 and the second flat portion F2.

The electroluminescent display device 100 according to an embodiment of the present disclosure may include the plurality of low-refractive members LP disposed on the overcoat layer 160.

The plurality of low-refractive members LP may be disposed to be spaced apart from each other. Consequently, the overcoat layer 160 may be exposed in an area in which the plurality of low-refractive members LP are spaced apart from each other.

Each of the plurality of low-refractive members LP may have a trapezoidal cross-section, but embodiments are not limited thereto.

A refractive index of each of the plurality of low-refractive members LP may be lower than those of the overcoat layer 160 and the first electrode 141.

A refractive index of each of the plurality of low-refractive members LP may be in a range of 1.3 to 1.49, but embodiments are not limited thereto.

Each of the plurality of low-refractive members LP may be formed of an inorganic matter. For example, each of the plurality of low-refractive members LP may be formed of silicon oxide ($SiO_2$), but embodiments are not limited thereto.

The first electrode 141 may be disposed on the plurality of low-refractive members LP and the overcoat layer 160.

The first electrode 141 may be disposed in a shape which follows the morphology of top surfaces of the plurality of low-refractive members LP and the overcoat layer 160. Namely, the first electrode 141 is deposited as conformal layer on the exposed surface and therefor follows the contour of that surface.

That is, in the first electrode 141, flat surfaces having different heights, in which its height is based on whether it is over the top surfaces of the plurality of low-refractive members LP or located only over the top surface of the overcoat layer 160. The height of the flat surfaces is alternately disposed, and an inclined surface configured to extend between the flat surfaces with different heights may be disposed.

To block the spread of outgassing from the overcoat layer 160 to the light-emitting diode D, a second protective layer (not shown) which has an insulating property may be disposed between the overcoat layer 160 and the first electrode 141.

In this case, the first electrode 141 may be an anode or cathode for supplying one of electrons or holes to the emitting layer 142.

A case in which the first electrode 141 of the electroluminescent display device 100 according to the embodiment of the present disclosure is an anode will be described as an example.

The first electrode 141 may include an amorphous metal oxide. For example, the amorphous metal oxide may include any one selected from the group consisting of indium zinc oxide (IZO), zinc tin oxide (ZTO), tin oxide ($SnO_2$), zinc oxide (ZnO), indium oxide ($In_2O_3$), gallium indium tin oxide (GITO), indium gallium zinc oxide (IGZO), zinc indium tin oxide (ZITO), indium gallium oxide (IGO), gallium oxide ($Ga_2O_3$), aluminum zinc oxide (AZO), and gallium zinc oxide (GZO).

The first electrode 141 may be connected to the source electrode 123 of the thin film transistor 120 through a contact hole formed in the overcoat layer 160 and may be separately formed in each pixel area.

Although the electroluminescent display device 100 according to the embodiment of the present disclosure has been described using an example which assumes that the thin film transistor 120 is an N-type thin film transistor in which the first electrode 141 is connected to the source electrode 123, embodiments are not limited thereto. When the thin film transistor 120 is a P-type thin film transistor, the first electrode 141 may also be connected to the drain electrode 124.

The first electrode 141 may also be electrically connected to the emitting layer 142 by coming into contact with the emitting layer 142 with a conductive material therebetween.

The first electrode 141 may have a refractive index of about 1.8 or higher, but embodiments are not limited thereto.

A bank layer 136 may be disposed on the overcoat layer 160 and the first electrode 141.

The bank layer 136 may include an opening 136a configured to expose the first electrode 141.

The bank layer 136 may be disposed between adjacent pixel (or subpixel) areas and serve to differentiate the adjacent pixel (or subpixel) areas.

The bank layer 136 may be formed of a photo acrylic organic material having a refractive index of about 1.6 or lower, but embodiments are not limited thereto.

In the electroluminescent display device 100 according to an embodiment of the present disclosure, a light extraction member EP may be disposed corresponding to an inclined surface of the first electrode 141.

That is, the light extraction member EP may be disposed at a predetermined slope corresponding to the inclined surface of the first electrode 141.

The light extraction member EP may be formed of the same material as that of the bank layer 136.

That is, since the light extraction member EP may be formed at the inclined surface of the first electrode 141 by using a process of forming the bank layer 136 without a separate process, a separate process is not required. For example, the bank layer 136 and the light extraction member EP may be formed using a transflective mask. According to one embodiment for forming the light extraction member, the bank layer is deposited as a conformal layer over the entire structure and then an anisotropic etch is carried out in the regions corresponding to the sub-pixel locations until the bank layer is fully removed from the flat surfaces, but this will leave the bank layer on the side walls of the low refractive members. This is similar to the technique used forming a side wall oxide spacers in MOS devices.

By disposing the light extraction member EP at the inclined surface of the first electrode 141, emission from the first and second flat portions F1 and F2 excluding the connecting portion CP of the light-emitting diode D is induced while light output from the first and second flat portions F1 and F2 is allowed to be efficiently output to the outside.

The emitting layer 142 may be disposed on the first electrode 141 and the light extraction member EP.

The emitting layer 142 may have a tandem white structure in which a plurality of emitting layers are stacked to emit white light.

For example, the emitting layer 142 may include a first emitting layer configured to emit blue light and a second emitting layer disposed on the first emitting layer and configured to emit light having a color which turns white when mixed with blue.

The second emitting layer may be an emitting layer configured to emit yellow-green light.

The emitting layer 142 may only include emitting layers that emit one of blue light, red light, and green light. In this case, the electroluminescent display device 100 may not include the color filter member 150.

Also, the emitting layer 142 may be disposed along the shape which follows the morphology of the first electrode 141 and the light extraction member EP.

The emitting layer 142 may be formed of an organic matter having a refractive index of about 1.8 or higher, but embodiments are not limited thereto.

The second electrode 143 for supplying one of electrons or holes to the emitting layer 142 may be disposed on the emitting layer 142.

In this case, the second electrode 143 may be an anode or a cathode.

A case in which the second electrode 143 of the electroluminescent display device 100 according to the embodiment of the present disclosure is a cathode will be described as an example.

The second electrode 143 may be formed of a conductive material, whose work function value is relatively small, which is located on a front surface of a display area. For example, the second electrode 143 may be formed of aluminum (Al), magnesium (Mg), silver (Ag), or an alloy thereof, but embodiments are not limited thereto.

The second electrode 143 may be disposed in the shape which follows the morphology of the emitting layer 142.

As described above, the low-refractive members LP, the first electrode 141, the light extraction member EP, the emitting layer 142, and the second electrode 143 form the light-emitting diode D.

That is, the light-emitting diode D may include the first flat portion F1 which corresponds to the low-refractive members LP in accordance with the low-refractive members LP which are spaced apart from each other, the second flat portion F2 which corresponds to an area in which the low-refractive members LP are spaced apart from each other (area in which the overcoat layer is exposed), and the connecting portion CP configured to extend from the first flat portion F1 and the second flat portion F2 to connect them, wherein the light extraction member EP may be disposed between the emitting layer 142 of the connecting portion CP of the light-emitting diode D and the first electrode 141.

Since the light-emitting diode D of the electroluminescent display device 100 according to an embodiment of the present disclosure has the first flat portion F1 and the second flat portion F2, whose heights differ, and the connecting portion CP at which the light extraction member EP is disposed as described above, an amount of emitted light may be increased, and an optical path of light trapped without being output to the outside may be changed to allow the light to be output to the outside. In this way, light extraction efficiency may be improved.

The optical path of the electroluminescent display device 100 according to the embodiment of the present disclosure will be described in more detail below.

Figure 4:
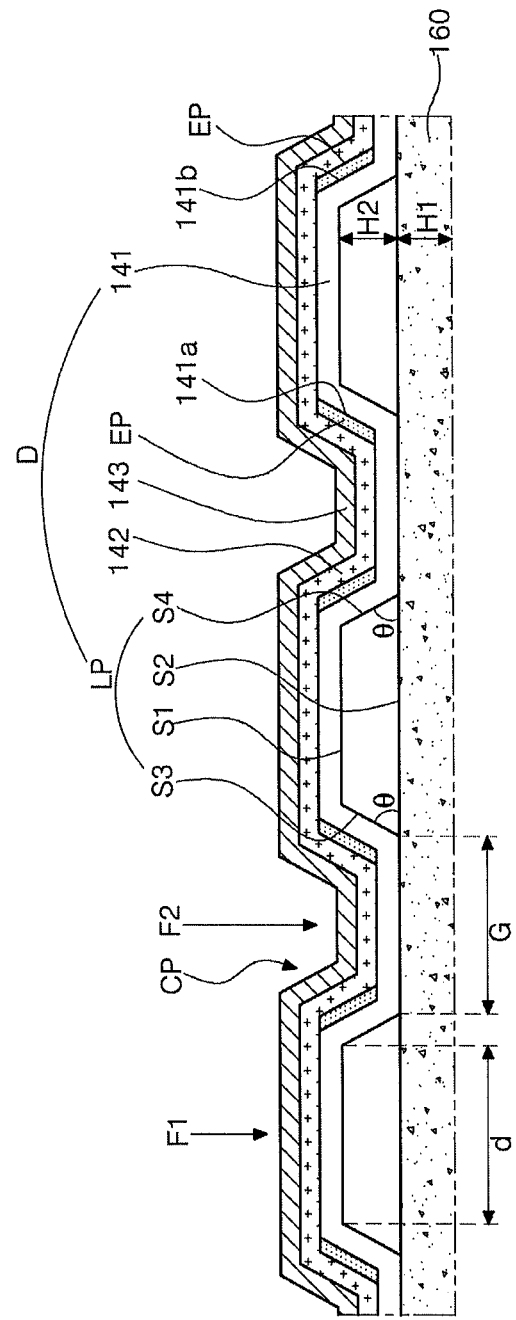
FIG. 4 is an enlarged view of portion A of FIG. 3.

FIG. 4 is an enlarged view of portion A of FIG. 3.

As illustrated in FIG. 4, a light-emitting diode D which includes a plurality of low-refractive members LP, a first electrode 141, a light extraction member EP, an emitting layer 142, and a second electrode 143 may be disposed on the overcoat layer 160.

The light-emitting diode D of the electroluminescent display device 100 according to the embodiment of the present disclosure may include a first flat portion F1 and a second flat portion F2, whose heights differ, and a connecting portion CP configured to extend between and connect the first flat portion F1 and the second flat portion F2.

Each of the plurality of low-refractive members LP may include a first flat surface S1 which comes into contact with the first electrode 141, a second flat surface S2 which comes into contact with the overcoat layer 160. In some embodiments, depending on the geometry of the low-refractive member LP, there can be first and second inclined surfaces S3 and S4 that extend between and connect the first flat surface S1 and the second flat surface S2. In other embodiments, there might be only single inclined surface, while in others, there might be multiple inclined surfaces, as explained later herein.

In other embodiments, there might be one or more layers between the LP member and the first electrode 141 or between the overcoat layer 160 and the first electrode 141. For example, there might be additional light transparent members overlaid on the exposed surface LP members and the overcoat layer prior to the first electrode being deposited An area of the second flat surface S2 may be greater than an area of the first flat surface S1.

An angle θ formed between the second flat surface S2 and the first and second inclined surfaces S3 and S4 may be an acute angle.

The acute angle may be in a range of 20° to 70°, but embodiments are not limited thereto.

That is, each of the plurality of low-refractive members LP may have a trapezoidal cross-section, but embodiments are not limited thereto. For example, if consider in three dimensions, each member LP might be a truncated cone, a truncated triangular pyramid, a trapezoidal pyramid (also called a truncated square pyramid); a truncated hexagonal pyramid, a bar or many other geometries.

The plurality of low-refractive members LP may be disposed at a predetermined distance G.

Consequently, the overcoat layer 160 may be exposed in an area in which the plurality of low-refractive members LP are spaced apart from each other.

A ratio d/G of a length d of the first flat surface S1 to the distance G between the plurality of low-refractive members LP may be in a range of 0.3 to 5, but embodiments are not limited thereto. Examples of different ratios of d/G and the effects of such are discussed in more detail elsewhere herein.

A ratio of a thickness H1 of the overcoat layer 160 to a thickness H2 of the plurality of low-refractive members LP may be in a range of 1 to 3, but embodiments are not limited thereto.

The thickness H2 of the low-refractive members LP refers to a distance between the first flat surface S1 and the second flat surface S2.

A refractive index of each of the plurality of low-refractive members LP may be lower than those of the overcoat layer 160 and the first electrode 141.

A refractive index of each of the plurality of low-refractive members LP may be in a range of 1.3 to 1.49, but embodiments are not limited thereto.

Each of the plurality of low-refractive members LP may be formed of an inorganic matter. For example, each of the plurality of low-refractive members LP may be formed of $SiO_2$, but embodiments are not limited thereto.

The overcoat layer 160 may be formed of an organic material having a refractive index in a range of about 1.5 to 1.55, but embodiments are not limited thereto.

The first electrode 141 may be disposed on the plurality of low-refractive members LP and the overcoat layer 160.

The first electrode 141 may be formed of an amorphous metal oxide having a refractive index of about 1.8 or higher, but embodiments are not limited thereto.

The first electrode 141 may be disposed in the shape which follows the morphology of top surfaces of the plurality of low-refractive members LP and the overcoat layer 160.

That is, the first electrode 141 may be disposed to cover the plurality of low-refractive members LP and the overcoat layer 160.

Accordingly, the first electrode 141 may have flat surfaces whose heights differ corresponding to the first flat surface S1 of the low-refractive members LP and the top surface of the overcoat layer 160 exposed within the distance G between the low-refractive members LP.

Third and fourth inclined surfaces 141a and 141b which correspond to the first and second inclined surfaces S3 and S4 of the low-refractive members LP may be formed in the first electrode 141.

That is, in the first electrode 141, flat surfaces having different heights in accordance with shapes of the first flat surface S1 of the plurality of low-refractive members LP and the top surface of the overcoat layer 160 may be alternately disposed, and the third and fourth inclined surfaces 141a and 141b configured to extend between and connect the flat surfaces having different heights may be disposed.

Particularly, in the electroluminescent display device 100 according to an embodiment of the present disclosure, a light extraction member EP may be disposed on the third and fourth inclined surfaces 141a and 141b of the first electrode 141.

That is, the light extraction member EP may be disposed at a predetermined slope corresponding to the third and fourth inclined surfaces 141a and 141b of the first electrode 141.

The light extraction member EP may be formed of the same material as that of the bank layer 136.

That is, since the light extraction member EP may be formed at the third and fourth inclined surfaces 141a and 141b of the first electrode 141 by using a process of forming the bank layer 136 without a separate process, a separate process is not required. For example, the bank layer 136 and the light extraction member EP may be formed using a transflective mask.

The emitting layer 142 may be disposed on the first electrode 141 and the light extraction member EP.

That is, the emitting layer 142 may be disposed in the shape which follows the morphology of the first electrode 141 and the light extraction member EP.

The emitting layer 142 may be formed of an organic material having a refractive index of about 1.8 or higher, but embodiments are not limited thereto.

The second electrode 143 may be disposed on the emitting layer 142.

The second electrode 143 may be disposed in the shape which follows the morphology of the emitting layer 142.

Accordingly, in the light-emitting diode D of the electroluminescent display device 100 according to the embodiment of the present disclosure, a first flat portion F1 which corresponds to the low-refractive members LP in accordance with the low-refractive members LP which are spaced apart from each other, a second flat portion F2 which corresponds to an area in which the low-refractive members LP are spaced apart from each other (area in which the overcoat layer is exposed), and a connecting portion CP configured to extend between and connect the first flat portion F1 and the second flat portion F2 may be formed.

The light extraction member EP may be disposed between the emitting layer 142 of the connecting portion CP and the first electrode 141.

Figure 5:
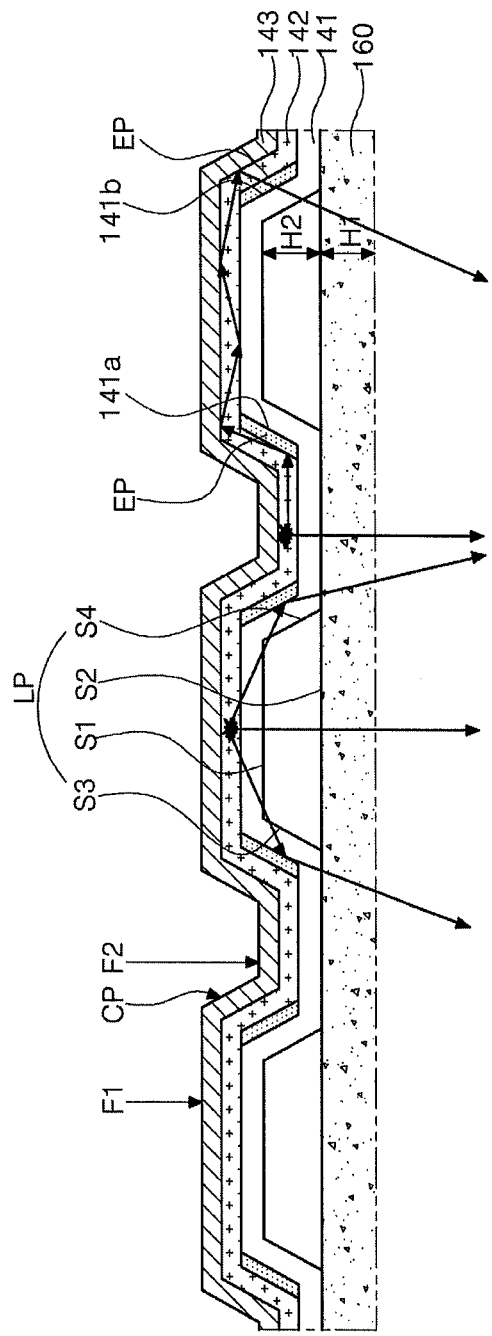
FIG. 5 is a view schematically illustrating an optical path of the electroluminescent display device according to an embodiment of the present disclosure.

FIG. 5 is a view schematically illustrating an optical path of the electroluminescent display device according to an embodiment of the present disclosure.

As illustrated in FIG. 5, a light-emitting diode D of the electroluminescent display device 100 according to an embodiment of the present disclosure may include a first flat portion F1 and a second flat portion F2, whose heights differ, and a connecting portion CP configured to extend between and connect the first flat portion F1 and the second flat portion F2.

Light may be output from an emitting layer 142 of each of the first flat portion F1 and the second flat portion F2, whose heights differ.

From among light output from the emitting layer 142 of the first flat portion F1, light vertically incident on low-refractive members LP may be output to the outside via the low-refractive members LP. From among light output from the emitting layer 142 of the first flat portion F1, an optical path of light incident at a predetermined slope on the low-refractive members LP is changed to be in a direction closer to the vertical direction so that the light may be output to the outside.

A portion of light output from the emitting layer 142 of the second flat portion F2 may be output to the outside via the overcoat layer 160, and another portion of the light may be output to the outside after being totally reflected and traveling inside the light-emitting diode D and then being re-reflected at the inclined second electrode 143 of the connecting portion CP.

That is, from among light emitted from each of the first flat portion F1 and the second flat portion F2 whose heights differ, light which has been totally reflected inside the light-emitting diode D and has been unable to be output to the outside may be extracted to the outside via the light extraction member EP and the second electrode 143 of the connecting portion CP. In this way, light extraction efficiency may be improved.

FIGS. 6A to 6D are plan views schematically illustrating low-refractive members of the electroluminescent display device according to an embodiment of the present disclosure.

As illustrated in FIGS. 6A to 6D, in the electroluminescent display device 100 (see FIG. 3) according to an embodiment of the present disclosure, low-refractive members LP may be disposed on the overcoat layer 160.

Figure 6A:
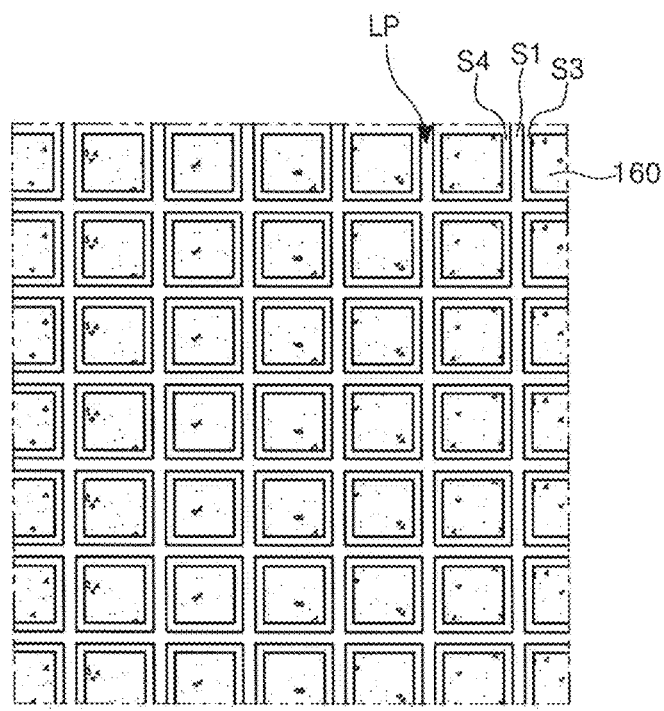
FIGS. 6A to 6D are plan views schematically illustrating low-refractive members of the electroluminescent display device according to an embodiment of the present disclosure.

That is, as illustrated in FIG. 6A, each of the plurality of low-refractive members LP may have a bar shape in plan view, and the plurality of low-refractive members LP may intersect with each other in the form of a mesh. In the embodiment in which the member LP is a bar, there will be a top surface S1 and inclined side surfaces S3 and S4 on either side, as shown in FIG. 6A. The bottom surface, S2 cannot be seen in the top plan view.

Figure 6B:
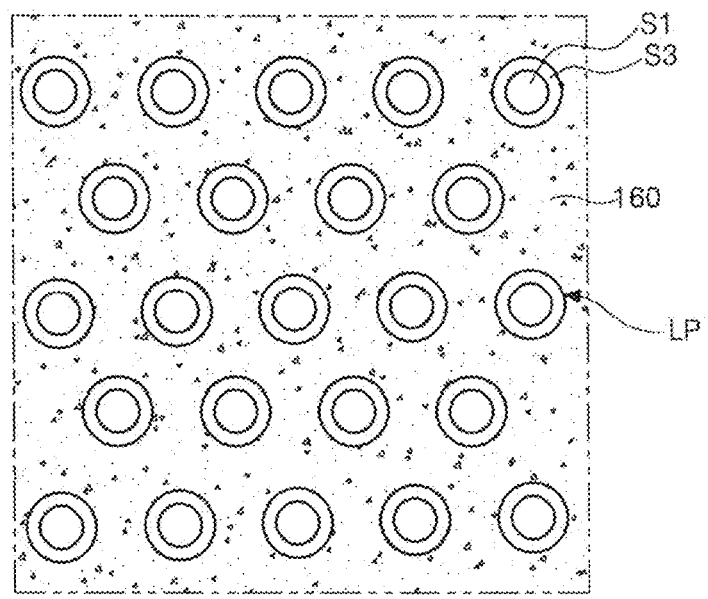

As illustrated in FIG. 6B, each of the plurality of low-refractive members LP may have a circular shape in plan view, and the plurality of low-refractive members LP may be disposed to be spaced apart from each other. From a geometry description, this embodiment of element LP will be a truncated cone and have a top surface S1 and an inclined side surface S3. For a cone, there is only a single inclined surface that extends as circular, single member from the top surface S1 to the bottom surface S2.

Figure 6C:
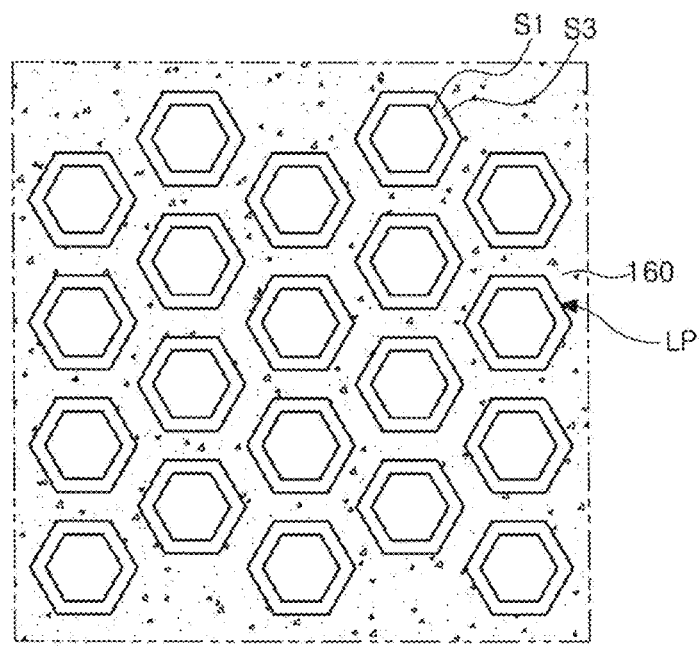

As illustrated in FIG. 6C, each of the plurality of low-refractive members LP may have a hexagonal shape in plan view, and the plurality of low-refractive members LP may be disposed to be spaced apart from each other. From a geometry description, this embodiment of element LP will be a truncated hexagonal pyramid and have a top surface S1 and six inclined side surfaces that extend to the bottom surface S2, which included side surfaces are not individually labelled for ease of reading the Figures.

Figure 6D:
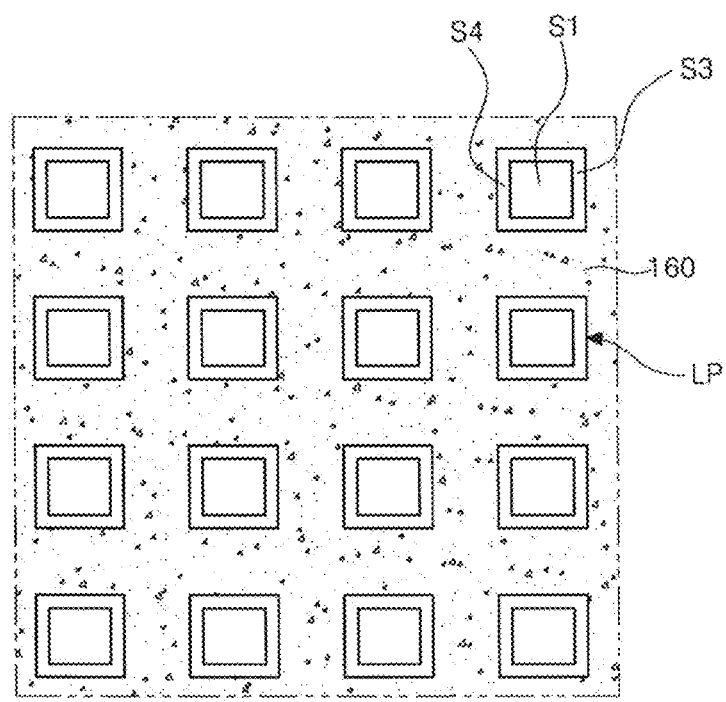

As illustrated in FIG. 6D, each of the plurality of low-refractive members LP may have a quadrilateral shape in plan view, and the plurality of low-refractive members LP may be disposed to be spaced apart from each other. From a geometry description, this embodiment of element LP will be a truncated square pyramid, also called a trapezoidal pyramid, and have a top surface S1 and four inclined side surfaces of which S3 and S4 labelled for ease of reading the Figures. It is also to be noted that the trapezoidal pyramids of FIG. 6D do not need to be organized in an array having all their flat edges in rows and columns. For example, all of the trapezoidal pyramids can be rotated 90° and thus have their points at the top and bottom, similar to an array of diamond shapes. The points of adjacent diamonds can be close to each other, even closer than a ratio of 1.0, but the flat edges can be farther than 1.0 so the overall average is 1.0. Similar changes in orientation and shape can be made for each of the embodiments disclosed herein.

The shapes in plan view of the plurality of low-refractive members LP illustrated in FIGS. 6A to 6D are merely examples, and each of the plurality of low-refractive members LP may have various other shapes in top plan view and other geometries in three dimensions to occupy a volume, as disclosed herein.

Figure 7A:
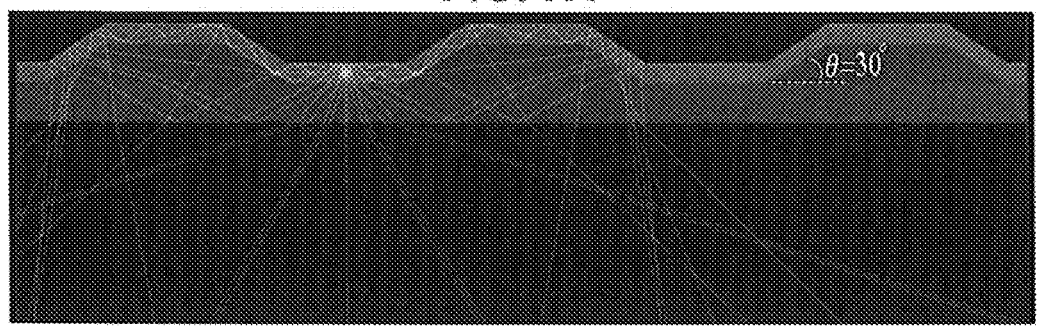
FIGS. 7A to 7C are views schematically illustrating optical paths in accordance with an angle formed between a second flat surface and first and second inclined surfaces of the electroluminescent display device according to an embodiment of the present disclosure.
Figure 7B:
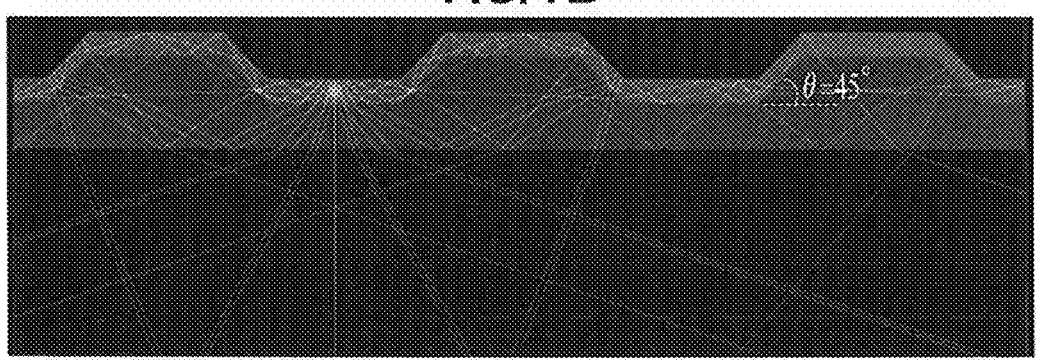
Figure 7C:
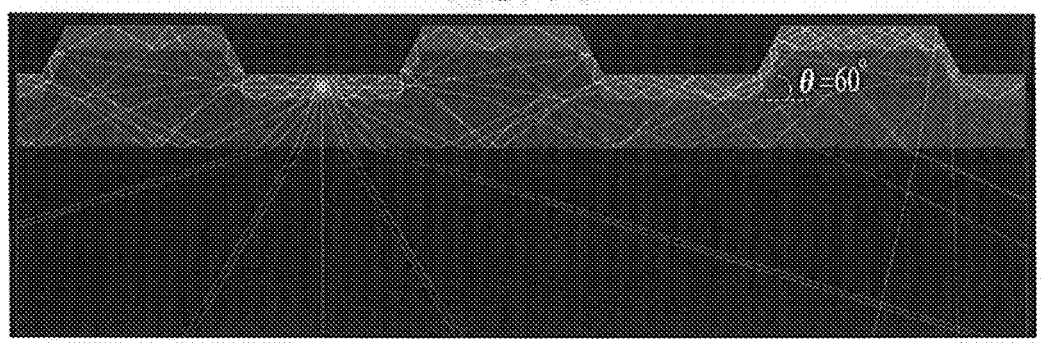

FIGS. 7A to 7C are views schematically illustrating optical paths in accordance with an angle formed between a second flat surface and first and second inclined surfaces of the electroluminescent display device according to an embodiment of the present disclosure.

FIG. 7A illustrates an optical path in a case in which an angle θ formed between the second flat surface S2 and the first and second inclined surfaces S3 and S4 is 30°, FIG. 7B illustrates an optical path in a case in which the angle θ formed between the second flat surface S2 and the first and second inclined surfaces S3 and S4 is 45°, and FIG. 7C illustrates an optical path in a case in which the angle θ formed between the second flat surface S2 and the first and second inclined surfaces S3 and S4 is 60°.

Comparing FIGS. 7A to 7C, it can be seen that light extraction efficiency is the highest in the case illustrated in FIG. 7A in which the angle θ formed between the second flat surface S2 and the first and second inclined surfaces S3 and S4 is 30°.

As can be appreciated, the angle selected for θ will also affect the ratio of area of the top surface S1 to the bottom surface S2. If a large angle for θ is selected, such as 60° or higher, then the area of S1 will be closer in size to the area of S2. On the other hand, if a small angle is selected for θ, such as 30° or less, the area of S1 will be relatively smaller than the area of S2.

That is, from among light emitted from each of the first flat portion F1 and the second flat portion F2 whose heights differ, an amount of light, which has been totally reflected inside the light-emitting diode D and has been unable to be output to the outside, that is extracted to the outside via the light extraction member EP and the second electrode 143 of the connecting portion CP may be the greatest.

Consequently, light extraction efficiency may be further improved by forming the angle θ between the second flat surface S2 and the first and second inclined surfaces S3 and S4 to be 30°.

Figure 8A:
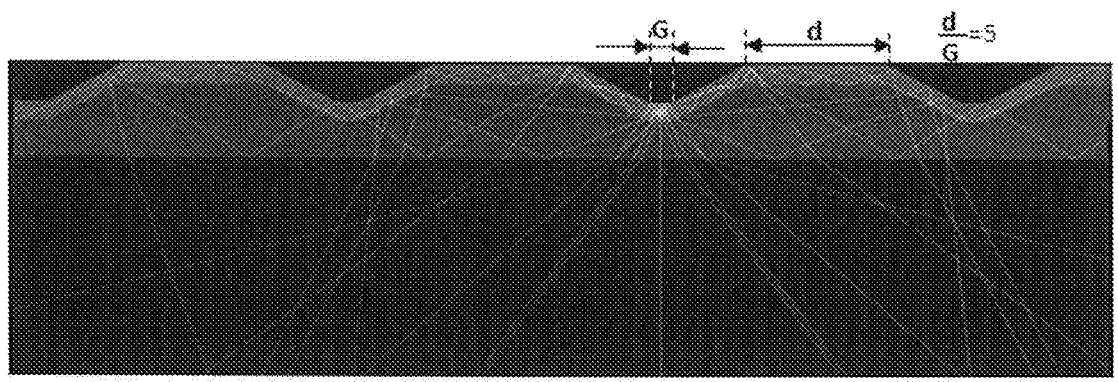
FIGS. 8A to 8C are views schematically illustrating optical paths in accordance with a ratio of a length of a first flat surface to a distance between the plurality of low-refractive members of the electroluminescent display device according to an embodiment of the present disclosure.
Figure 8B:
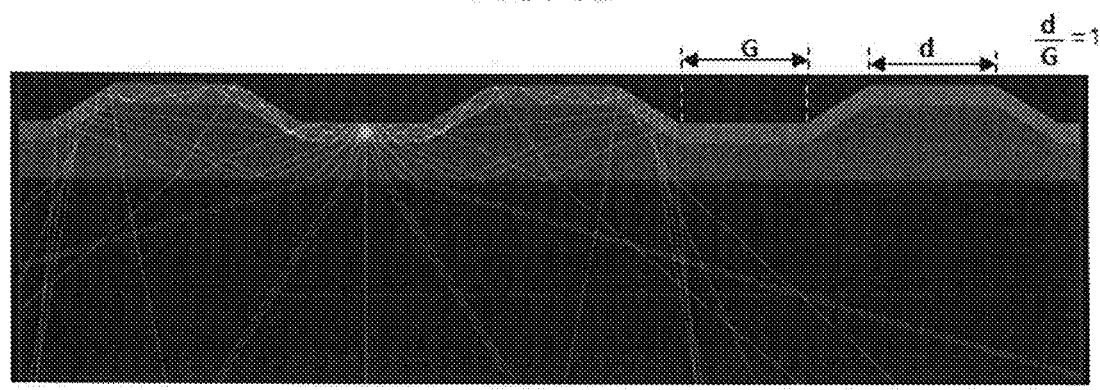
Figure 8C:
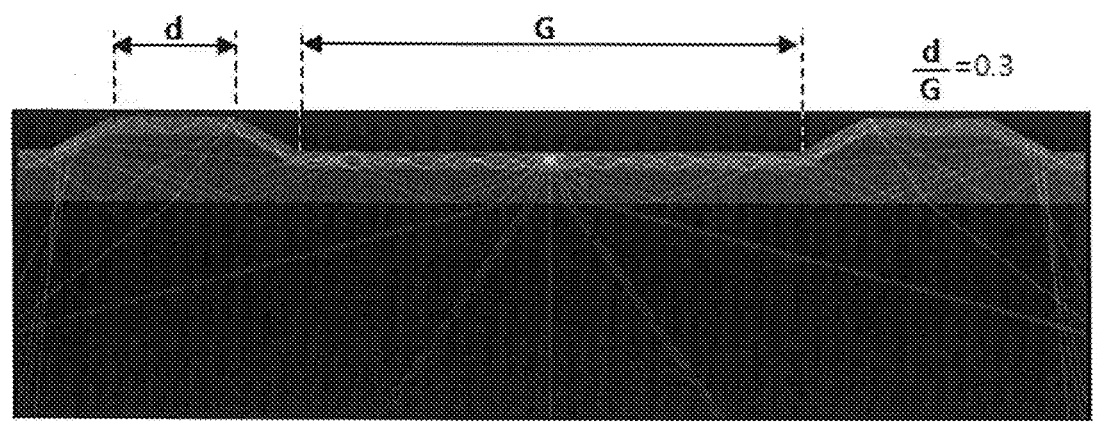

FIGS. 8A to 8C are views schematically illustrating optical paths in accordance with a ratio of a length of a first flat surface S1 to a distance between the plurality of low-refractive members of the electroluminescent display device according to an embodiment of the present disclosure. Description will be given with reference to FIGS. 4 and 8A to 8C. FIG. 8A illustrates an optical path in a case in which a ratio d/G of a length d of the first flat surface S1 to a distance G between the plurality of low-refractive members LP is 5. This ratio of 5 or greater might occur if the LP member is bar, as shown in FIG. 6A.

FIG. 8B illustrates an optical path in a case in which the ratio d/G of the length d of the first flat surface S1 to the distance G between the plurality of low-refractive members LP is 1. This ratio of 1 can be achieved if the LP member is a truncated cone of the type shown in FIG. 6B or the trapezoidal pyramids are spaced equally far apart as the length of the bottom side S2, which is slightly more spacing than shown in 6D.

FIG. 8C illustrates an optical path in a case in which the ratio d/G of the length d of the first flat surface S1 to the distance G between the plurality of low-refractive members LP is 0.3. This ratio is similar to what might be found in the embodiment of FIG. 6C looking at a cross-section location at which the truncated hexagonal pyramids are the closest to each other.

Comparing FIGS. 8A to 8C, it can be seen that light extraction efficiency is the highest in the case illustrated in FIG. 8B in which the ratio d/G of the length d of the first flat surface S1 to the distance G between the plurality of low-refractive members LP is 1. That is, from among light emitted from each of the first flat portion F1 and the second flat portion F2 whose heights differ, an amount of light, which has been totally reflected inside the light-emitting diode D and has been unable to be output to the outside, that is extracted to the outside via the light extraction member EP and the second electrode 143 of the connecting portion CP may be the greatest.

Of course, for any geometry of the LP members, the spacing can be selected to achieve a ratio of anywhere between 5, 1 and 0.3. The embodiment of a truncated hexagonal pyramids, truncated triangular pyramids and other structures have the benefit that at some locations, the ratio can be about 0.5, while at other locations, the ratio might be 2.0 or 3.0. This can be seen viewing FIG. 6C in which at some locations, where flat sides of the member LP are next to each other, the structures are close and have a ratio of less than 1, about 0.3 in this embodiment, but at locations where the points are adjacent to each other, the ratio might be greater than 1. Thus, in some embodiments, the average ratio for a particular pattern of LP members can be selected to be about 1, even though the exact ratio at some cross-section locations might be less than 1, or even less than 0.5 and the ratio at other locations will be greater than 1, for example, greater than 2.0. Thus, it is not required that the ratio be 1.0 at all locations, but an average of about 1.0 is acceptable. It is also acceptable to have a ratio of about 1 at the closest location and a ratio greater than 1 at other locations, so the overall average is about 2.0.

Consequently, light extraction efficiency may be further improved by forming the average ratio d/G of the length d of the first flat surface S1 to the distance G between the plurality of low-refractive members LP to be 1.

Figure 9A:
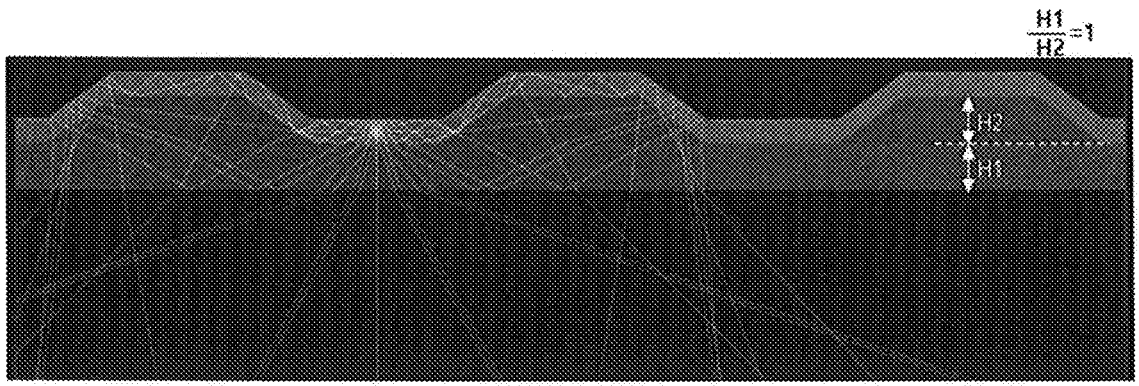
FIGS. 9A to 9C are views schematically illustrating optical paths in accordance with a ratio of a thickness of an overcoat layer to a thickness of the plurality of low-refractive members of the electroluminescent display device according to an embodiment of the present disclosure.
Figure 9B:
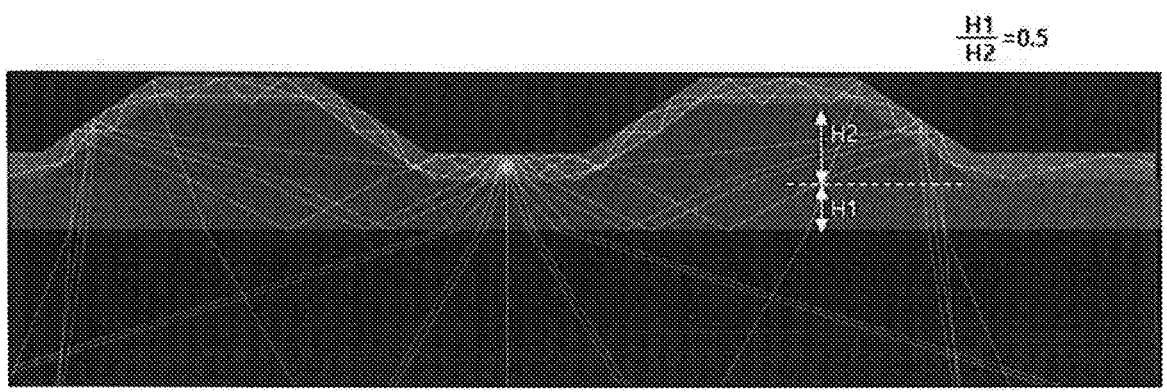
Figure 9C:
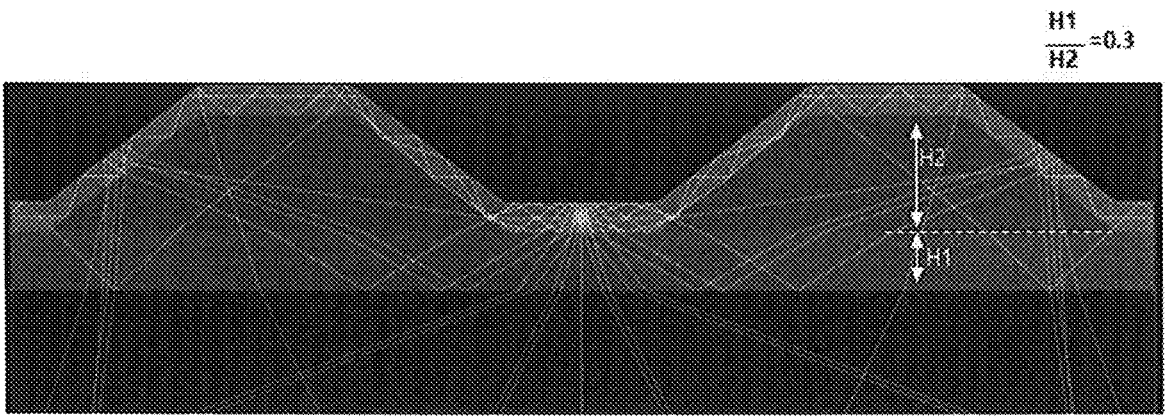

FIGS. 9A to 9C are views schematically illustrating optical paths in accordance with a ratio of a thickness of an overcoat layer to a thickness of the plurality of low-refractive members of the electroluminescent display device according to an embodiment of the present disclosure.

FIG. 9A illustrates an optical path in a case in which a ratio H1/H2 of a thickness H1 of the overcoat layer 160 to a thickness H2 of the plurality of low-refractive members LP is 1, FIG. 9B illustrates an optical path in a case in which the ratio H1/H2 of the thickness H1 of the overcoat layer 160 to the thickness H2 of the plurality of low-refractive members LP is 0.5, and FIG. 9C illustrates an optical path in a case in which the ratio H1/H2 of the thickness H1 of the overcoat layer 160 to the thickness H2 of the plurality of low-refractive members LP is 0.3.

Comparing FIGS. 9A to 9C, it can be seen that light extraction efficiency is the highest in the case illustrated in FIG. 9A in which the ratio H1/H2 of the thickness H1 of the overcoat layer 160 to the thickness H2 of the plurality of low-refractive members LP is 1.

That is, from among light emitted from each of the first flat portion F1 and the second flat portion F2 whose heights differ, an amount of light, which has been totally reflected inside the light-emitting diode D and has been unable to be output to the outside, that is extracted to the outside via the light extraction member EP and the second electrode 143 of the connecting portion CP may be the greatest.

Consequently, light extraction efficiency may be further improved by forming the ratio H1/H2 of the thickness H1 of the overcoat layer 160 to the thickness H2 of the plurality of low-refractive members LP to be 1.

As described above, in the light-emitting diode D of the electroluminescent display device 100 according to the embodiment of the present disclosure, the first flat portion F1 which corresponds to the low-refractive members LP in accordance with the low-refractive members LP which are spaced apart from each other, the second flat portion F2 which corresponds to the area in which the low-refractive members LP are spaced apart from each other (area in which the overcoat layer is exposed), and the connecting portion CP configured to extend between and connect the first flat portion F1 and the second flat portion F2 are formed, wherein the light extraction member EP is disposed between the emitting layer 142 of the connecting portion CP and the first electrode 141.

Accordingly, emission from the first and second flat portions F1 and F2 of the light-emitting diode D is induced so that light is emitted from each of the first flat portion F1 and the second flat portion F2 whose heights differ. In this way, an amount of emitted light may be increased, and an optical path of light trapped without being output to the outside may be changed to allow the light to be output to the outside, thereby improving light extraction efficiency.

In the present disclosure, a low-refractive member is disposed below a first electrode and a light extraction member is formed on an inclined surface of the first electrode so that light trapped in a substrate without being output to the outside of the substrate is allowed to be output to the outside. In this way, light extraction efficiency can be effectively improved.

It will be apparent to those skilled in the art that various modifications and variations can be made in the embodiments of the invention without departing from the spirit or scope of the invention. Thus, it is intended that the modifications and variations cover this invention provided they come within the scope of the appended claims and their equivalents.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electroluminescent display device comprising:
   an overcoat layer on a substrate;
   a plurality of low-refractive members formed of an inorganic matter and disposed on the overcoat layer;
   a first electrode on the overcoat layer and the plurality of low-refractive members;
   a bank layer disposed on the overcoat layer and the first electrode and including an opening configured to expose the first electrode;
   an emitting layer disposed on the first electrode; and
   a second electrode disposed on the emitting layer,
   wherein each of the plurality of low-refractive members includes a first flat surface overlaid by the first electrode, a second flat surface below the first flat surface, the second flat surface having an area greater than that of the first flat surface and overlying the overcoat layer, the low-refractive member including first and second inclined surfaces extending between the first flat surface and the second flat surface, and
   wherein a refractive index of each of the plurality of low-refractive members is lower than those of the overcoat layer and the first electrode.

2. The electroluminescent display device of claim 1, wherein the first electrode is disposed to conform to the shape of the top surfaces of the plurality of low-refractive members and the overcoat layer, the first electrode including third and fourth inclined surfaces corresponding to the first and second inclined surfaces.

3. The electroluminescent display device of claim 2, further comprising:
   a light extraction member disposed between the third and fourth inclined surfaces and the emitting layer.

4. The electroluminescent display device of claim 1, wherein an angle between the second flat surface and each of the first and second inclined surfaces is in a range of about 20° to 70°.

5. The electroluminescent display device of claim 1, wherein:
   the plurality of low-refractive members are disposed at a selected distance from each other, and
   a ratio of a length of the first flat surface to a distance between the plurality of low-refractive members is in a range of about 0.3 to 5.

6. The electroluminescent display device of claim 1, wherein a ratio of a thickness of the overcoat layer to a thickness of the plurality of low-refractive members is in a range of 0.3 to 1.

7. The electroluminescent display device of claim 3, wherein the light extraction member and the bank layer are formed of the same material.

8. The electroluminescent display device of claim 1, wherein each of the low-refractive members has a shape of a trapezoidal pyramid.

9. The electroluminescent display device of claim 1, wherein each of the low-refractive members has a shape of a truncated cone.

10. The electroluminescent display device of claim 1, wherein each of the low-refractive members has a shape of a truncated hexagonal pyramid.

11. The electroluminescent display device of claim 5, wherein:
    an average ratio of a length of the first flat surface to a distance between the plurality of low-refractive members is in a range of about 0.5 to 2.

12. The electroluminescent display device of claim 5, wherein:
    an average ratio of a length of the first flat surface to a distance between the plurality of low-refractive members is in a range of about 0.8 to 1.2.

13. The electroluminescent display device of claim 12, wherein:
    the ratio of a length of the first flat surface to a distance between the plurality of low-refractive members is less than 0.5 at some locations and greater than 2 at other locations.

14. The electroluminescent display device of claim 1, wherein the first electrode is directly contacting the low refractive member.

15. The electroluminescent display device of claim 1, wherein the first electrode is directly contacting the overcoat layer.

* * * * *